United States Patent [19]

Williams et al.

[11] Patent Number: 5,296,765
[45] Date of Patent: Mar. 22, 1994

[54] DRIVER CIRCUIT FOR SINKING CURRENT TO TWO SUPPLY VOLTAGES

[75] Inventors: Richard K. Williams, Cupertino; Barry J. Concklin, San Jose, both of Calif.

[73] Assignee: Siliconix Incorporated, Santa Clara, Calif.

[21] Appl. No.: 855,377

[22] Filed: Mar. 20, 1992

[51] Int. Cl.$^5$ .................................... H03K 17/16
[52] U.S. Cl. ........................ 307/572; 307/254; 307/255; 307/263; 307/300; 307/570; 307/246; 307/270
[58] Field of Search ............... 307/254, 255, 268, 300, 307/315, 270, 570, 631, 633, 634, 637, 642, 473, 296.1, 296.2, 296.4, 263, 246, 443, 572

[56] References Cited

U.S. PATENT DOCUMENTS

| | | | |
|---|---|---|---|
| 3,936,676 | 2/1976 | Fujita | 307/296.1 |
| 4,027,305 | 5/1977 | Kishimoto | 307/270 |
| 4,324,991 | 4/1982 | Tamaki | 307/443 |
| 4,553,044 | 11/1985 | Bittner | 307/270 |
| 4,694,203 | 2/1987 | Uragami et al. | 307/446 |
| 4,697,103 | 9/1987 | Ferris et al. | 307/456 |
| 4,725,741 | 2/1988 | Shekhawat et al. | 307/315 |
| 4,727,266 | 2/1988 | Fujii et al. | 307/443 |
| 4,880,998 | 11/1989 | Ueda | 307/446 |
| 4,886,982 | 12/1989 | Villa et al. | 307/254 |
| 5,055,705 | 10/1991 | Hall | 307/296.4 |
| 5,079,448 | 1/1992 | Matsumoto | 307/456 |
| 5,083,045 | 1/1992 | Yim et al. | 307/350 |
| 5,095,229 | 3/1992 | Yun et al. | 307/446 |
| 5,138,195 | 8/1992 | Satou et al. | 307/446 |

FOREIGN PATENT DOCUMENTS

0240637 11/1986 Fed. Rep. of Germany ...... 307/255

Primary Examiner—William L. Sikes
Assistant Examiner—Terry D. Cunningham
Attorney, Agent, or Firm—Skjerven, Morrill, MacPherson, Franklin & Friel

[57] ABSTRACT

An insulated gate bipolar transistor (IGBT) gate driver circuit with a push-pull output stage which provides current sinking to two power supply rails. Current sinking to a low impedance power supply rail (GND) via a high current NPN bipolar transistor provides fast IGBT turn off. A PNP bipolar transistor forward biased emitter-base junction in series with an N channel field effect transistor provides current-limited current sinking to a higher impedance power supply rail ($V_{EE}$). The on resistance of the N channel field effect transistor can be chosen to set the maximum current drawn from the higher impedance $V_{EE}$ power supply rail. This current-limiting avoids the need for a second low impedance power supply. The transition of the output of the driver from ground to $V_{EE}$ is only a function of the output voltage output by the driver. It is not a function of any timed switching of transistors.

31 Claims, 6 Drawing Sheets

DRIVER CIRCUIT FOR SINKING CURRENT TO TWO SUPPLY VOLTAGES

BACKGROUND OF THE INVENTION

1. Field of the Invention

This invention relates to driver circuits for sinking current to two supply voltages. More particularly, this invention relates to driver circuits for driving a gate of an insulated gate bipolar transistor.

2. Background Information

Figure 1:
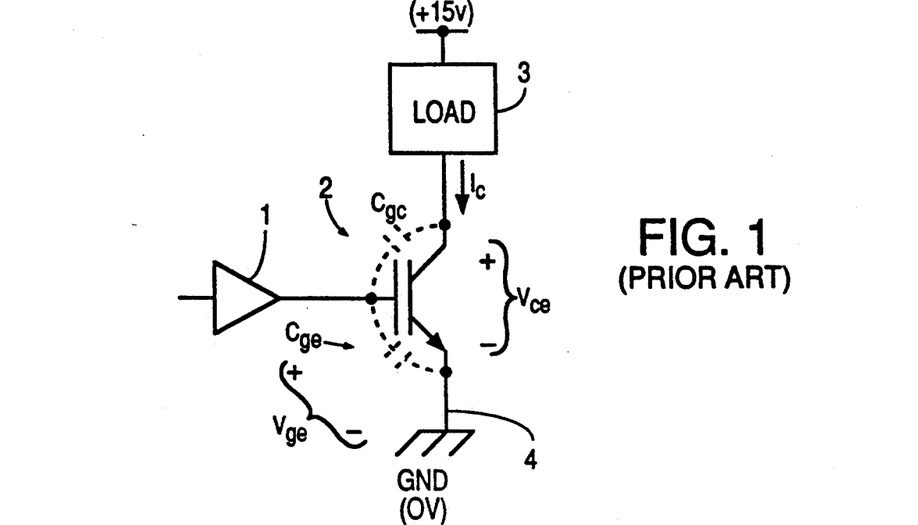
FIG. 1 (Prior Art) shows the gate-to-collector capacitance $C_{gc}$ which gives rise to a false turn on of an IGBT which may occur when the IGBT is switched off with a conventional driver.

FIG. 1 (Prior Art) shows a gate driver 1 for driving the gate of a gate insulated bipolar transistor ("IGBT") 2. Such a gate driver should provide a relatively high output voltage of 10 to 15 volts in order to enhance adequately the conductivity of the IGBT so that conduction losses are minimized when the IGBT conducts from collector to emitter. FIG. 1 shows a load 3 connected between a positive relatively high supply voltage source $V_{+HV}$ and the collector of the IGBT 2. In order to switch the IGBT off, however, the driver 1 must also be capable of quickly discharging the gate-to-emitter and gate-to-collector capacitances of the IGBT, $C_{ge}$ and $C_{gc}$, respectively in order to effectively pull down the base of the IGBT 2. A low impedance supply voltage line 4 connects to the emitter of the IGBT to a zero volt ground in order to accommodate the pulse of capacitive discharge current when the voltage on the gate is increased and in order to conduct the high conduction current from the emitter when IGBT 2 is switched on.

Figure 2A:
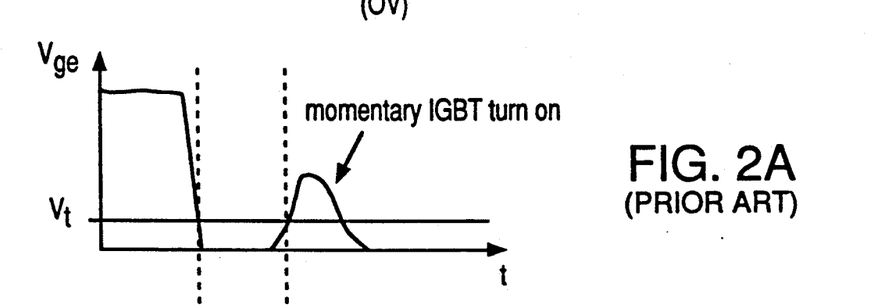
FIGS. 2A-2C (Prior Art) show a relationship between the gate-to-emitter voltage, the collector current, and the collector-to-emitter voltage in the IGBT driven with the conventional driver of FIG. 1.
Figure 2B:
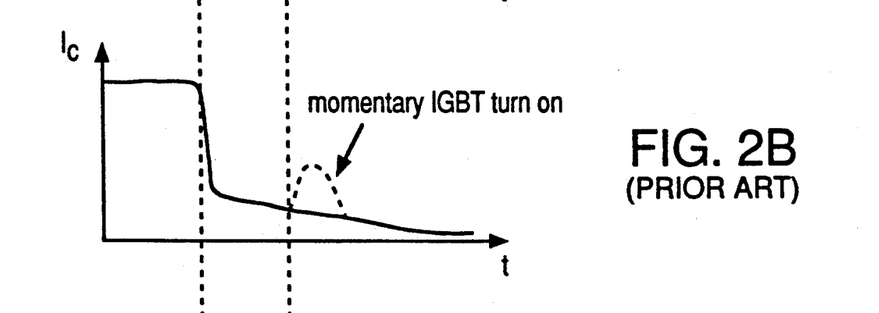
Figure 2C:
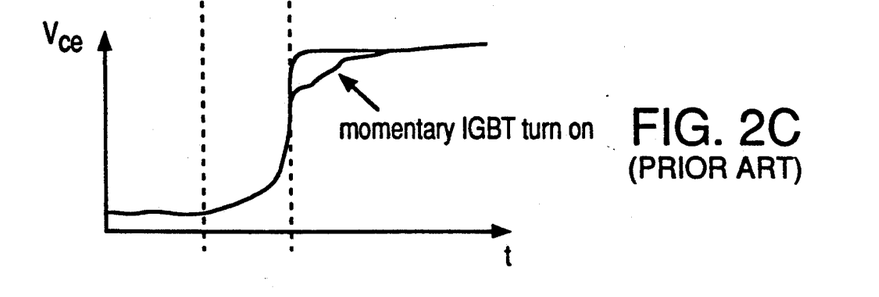

During switching off of IGBT 2, the voltage on the collector of the IGBT increases rapidly. FIGS. 2A, 2B and 2C show the gate-to-emitter voltage $V_{ge}$ of IGBT 2 of FIG. 1, the collector current $I_c$ of IGBT 2 of FIG. 1, and the collector-to-emitter voltage $V_{ce}$ of IGBT 2 of FIG. 1. As FIGS. 2A–2C show, the rapid decrease in gate-to-emitter voltage $V_{ge}$ associated with IGBT 2 switching off results in a rapid decrease in collector current Ic as well as a rapid increase in the collector-to-emitter voltage $V_{ce}$. This rapid increase in the collector-to-emitter $V_{ce}$ voltage causes a temporary increase in the gate-to-emitter voltage $V_{ge}$ due to capacitive coupling of the gate-to-collector capacitance $C_{gc}$ of IGBT 2. During the time when the IGBT collector exhibits its highest rate of increase in voltage as seen in FIG. 2C, current flow through the gate-to-collector capacitance may exceed the ability of driver circuit to sink current from the gate of the IGBT 2. If the gate-to-emitter voltage momentarily rises above the threshold voltage $V_t$ of the IGBT shown in FIG. 2A, the IGBT may momentarily switch back on despite the fact that driver circuit 1 is attempting to switch IGBT 2 off.

The consequence of this momentary switching on of IGBT 2 when the IGBT is in the process of being switched off is a high conduction current $I_c$ and a simultaneous high collector-to-emitter voltage $V_{ce}$. This high current and high voltage situation results in a large amount of power being dissipated. The IGBT may therefore be pushed beyond its safe operating region resulting in a loss of circuit efficiency and possible device breakdown.

Gate driver circuits with low impedance pull down devices are known. Although these drivers are able to sink higher currents from the gate of the IGBT to ground, these drivers nevertheless still result in momentary false turn-on situations due to the decrease of the threshold $V_t$ of the IGBT with increasing temperature. Although it is possible to compensate for this decrease in $V_t$ with temperature by increasing the threshold of the IGBT, such compensation results in a deleterious decrease in device efficiency during conduction.

Figure 3A:
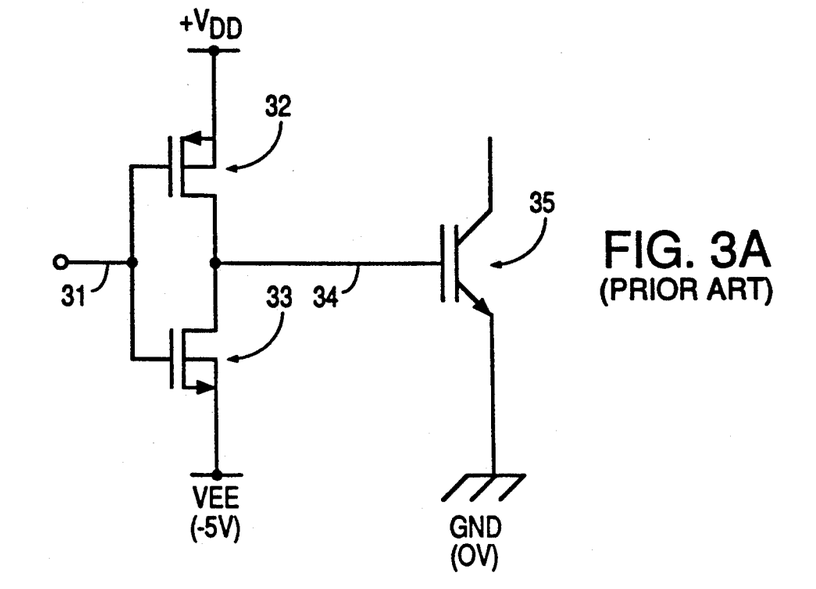
FIG. 3A (Prior Art) shows an IGBT driven with a CMOS inverter connected between $V_{DD}$ and $V_{EE}$.

What is needed is a low impedance pull down gate driver which can pull the potential of the gate of the IGBT below the potential of the emitter of the IGBT. FIGS. 3A (Prior Art) and FIG. 3B (Prior Art) show two such gate driver circuits which drive the gate of the IGBT below the potential of the IGBT emitter.

FIG. 3A (Prior Art) shows a CMOS inverter driver circuit comprised of an input terminal 31 connected to the gate of a PMOS transistor 32 and to the gate of a NMOS transistor 33. The source of PMOS transistor 32 is connected to $+V_{DD}$ which is, for example, +15 volts. The source of the NMOS transistor 33 is connected to $V_{EE}$ which is, for example, −5 volts. The drain of PMOS transistor 32 is connected to output node 34 which is connected to the gate of an IGBT to be driven 35. The drain of NMOS transistor 33 is also connected to the gate of IGBT 35. The emitter of IGBT 35 is connected to a ground supply voltage GND, for example, 0 volts.

Figure 3B:
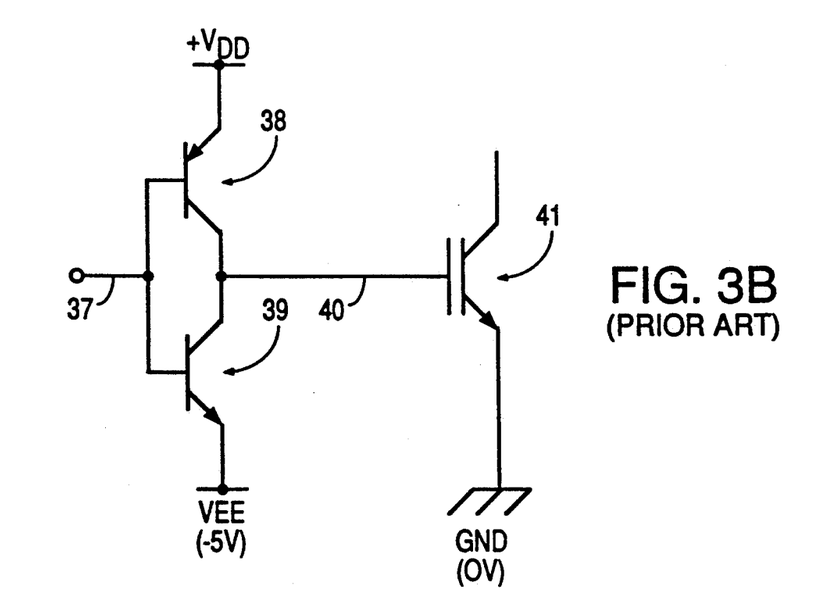
FIG. 3B (Prior Art) shows an IGBT driven with a bipolar inverter connected between $V_{DD}$ and $V_{EE}$.

FIG. 3B (Prior Art) shows a low impedance pull down bipolar inverter driver comprised of input terminal 37 connected to the base of an PNP bipolar transistor 38 and the base of an NPN bipolar transistor 39. The emitter of PNP bipolar transistor 38 is connected to $+V_{DD}$ which is, for example, +15 volts. The emitter of NPN transistor 39 is connected to $V_{EE}$ which is, for example, −5 volts. The collector of PNP transistor 38 is connected to output node 40 which is connected to the gate of an IGBT to be driven 41. The collector of NPN bipolar transistor 39 is also connected to the gate of IGBT 41. The emitter of IGBT 41 is connected to a ground supply voltage GND.

The problem with the low impedance pull down gate drivers of FIGS. 3A and 3B relates to the nature of the $V_{EE}$ supply voltage. The gate drivers of FIGS. 3A and 3B discharge the capacitive discharge current from the gate of the IGBTs only to the $V_{EE}$ supply voltage. The $V_{EE}$ supply voltage, unlike a ground supply voltage, usually has a relatively high series impedance. The $V_{EE}$ supply voltage is usually generated by an on-chip back bias charge pump circuit. Such charge pump circuits are usually designed to output small amounts of current. Accordingly, large surges of capacitive discharge current drawn from a standard $V_{EE}$ supply may result in a rise in the potential of the $V_{EE}$ supply itself. Although the gate driver is only driving the gate of an IGBT, the equivalent capacitance of the gate of the IGBT may exceed 5000 pF. To switch this large capacitance quickly can require a surge of several amperes of current. As a result, when the gate drivers of FIGS. 3A and 3B switch to pull the voltage on the gate of the IGBT down to the $V_{EE}$ supply voltage, large surges of current from the $V_{EE}$ supply may overburden the $V_{EE}$ charge pump, thereby causing the voltage supplied by the charge pump to rise several volts above $V_{EE}$ and thereby causing the voltage on the gate of the IGBT to rise.

Allowing $V_{EE}$ which powers the gate drive buffer to rise is equivalent to allowing the gate potential to rise. As a result, false turn on of the IGBT may occur despite the negative gate drive circuitry. What is needed is a gate drive circuit which sinks most of the gate drive current to a guaranteed low impedance supply such as ground, yet provides the beneficial noise margins of a negative gate drive to assure that the device remains off as desired under all conditions. Ground, it should be noted, is a guaranteed low impedance supply rail because it must be capable of conducting the potentially large current $I_C$ of the IGBT. Compared to this current level, the gate drive current requirements are negligible, (e.g., $I_{gpeak}=2A$, $I_{cpeak}=300 A$).

SUMMARY OF THE INVENTION

The present invention therefore provides a gate driver which includes a low impedance high current path between the gate of the IGBT and a ground supply voltage as well as a higher impedance low current path between the gate of the IGBT and a $V_{EE}$ supply voltage. The gate driver initially conducts a relatively high amount of current from the gate of the IGBT to the low impedance ground supply voltage in order to discharge the gate capacitance rapidly to ground potential. The gate driver therefore only needs to conduct a smaller magnitude of current from the gate of the IGBT to the higher impedance $V_{EE}$ supply in order to pull the gate of the IGBT from ground potential down to the negative $V_{EE}$ supply voltage. Accordingly, the gate driver of the present invention allows a relatively small, relatively high impedance charge pump circuit to be used as the source of the $V_{EE}$ supply voltage.

BRIEF DESCRIPTION OF THE DRAWINGS

FIG. 4 is a circuit diagram of a first embodiment of the present invention for sinking current to ground for fast turn off of the IGBT and then for sinking current to $V_{EE}$ to prevent false IGBT turn on.

DETAILED DESCRIPTION OF THE INVENTION

Figure 4:
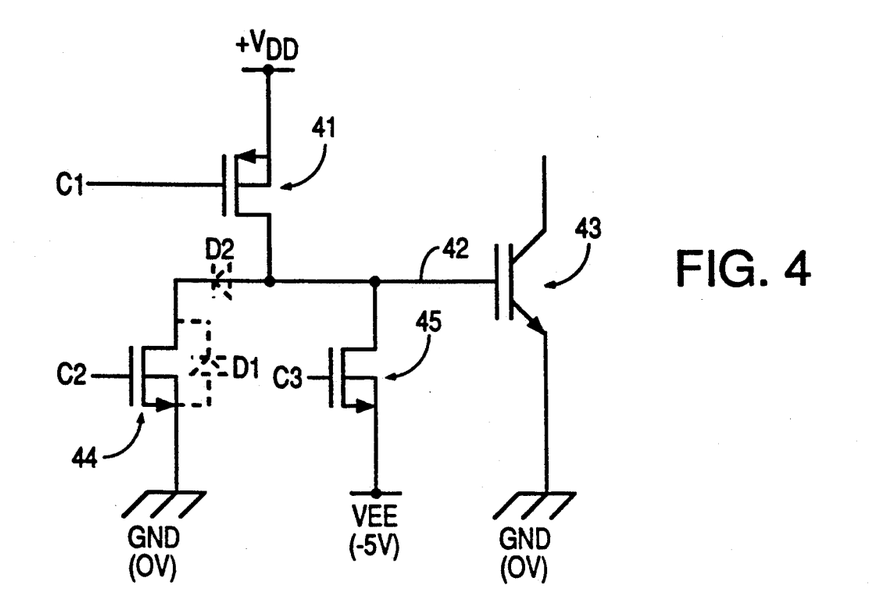

FIG. 4 is a circuit diagram of a first embodiment of the gate driver of the present invention. FIG. 4 shows an MOS gate driver circuit which sinks current to a low impedance ground GND for fast turn off of the IGBT 43 and which subsequently sinks current to a relatively higher impedance negative voltage source $V_{EE}$. A first control node C1 controls the voltage of a gate of a P channel field effect transistor 41. The source of transistor 41 is connected to a $V_{DD}$ supply voltage whereas the drain is connected to a node 42. Node 42 is connected to the gate of IGBT 43. The emitter of IGBT 43 is connected to low impedance ground GND. A second control node C2 controls the voltage on a gate of a first N channel field effect transistor 44. The drain of transistor 44 is connected to node 42 whereas the source of transistor 44 is connected to the low impedance ground GND. A third control node C3 controls the voltage on a gate of a second N channel field effect transistor 45. The drain of transistor 45 is connected to node 42 whereas the source of transistor 45 is connected to a relatively high impedance supply voltage $V_{EE}$. The term "low impedance supply voltage" refers to a voltage (such as ground) which is supplied through a low series impedance whereas the term "high impedance supply voltage" refers to another voltage (such as $V_{EE}$) which is supplied from a voltage source (such as a back-bias generator) having a relatively high series impedance.

In operation, to raise the voltage on the gate of IGBT 43, the voltage on first control node C1 is lowered when the voltages on second and third control nodes C2 and C3 are low. Transistor 41 therefore switches on to pull the voltage on the gate of IGBT 43 up to $V_{DD}$ while transistors 44 and 45 remain turned off in a nonconductive state.

To lower the voltage on the gate of IGBT 43 in order to switch IGBT 43 off, the voltage on first control node C1 is raised to switch transistor 41 off. The third control node C3 is kept low to ensure that transistor 45 remains non-conductive. Once transistor 41 is nonconductive, the voltage on second control node C2 is raised to switch transistor 44 on. The low impedance supply GND is therefore coupled to the gate of IGBT 43 and the voltage on the gate of IGBT 43 is pulled down toward ground GND. Once the voltage on the gate of IGBT 43 has reached ground potential or a voltage substantially close to ground potential, control node C2 is lowered and transistor 44 is switched off. With transistors 44 and 41 in non-conductive states, the voltage on control node C3 can be raised to switch transistor 45 on. When transistor 45 is conductive, a path between the higher impedance supply voltage $V_{EE}$ and the gate of IGBT 43 is established. The voltage on the gate of IGBT 43 is therefore pulled from ground toward the $V_{EE}$ voltage in such a way that all the charge necessary to pull the gate of IGBT 43 to $V_{EE}$ does not need to be provided from the $V_{EE}$ supply.

In the circuit of FIG. 4, the switching of transistors 41, 44 and 45 are carefully controlled to prevent "shoothrough" or cross-over current to flow from the $V_{DD}$ supply voltage to either the ground GND supply voltage or to the $V_{EE}$ supply voltage. This shoothrough current from $V_{DD}$ to ground will occur if transistor 41 is on for a period of time when transistor 44 is on. Similarly, shoothrough from ground to the $V_{EE}$ supply voltage must be prevented. Such shoothrough current will occur if transistor 44 is on for a period of time when transistor 45 is on. The circuit of FIG. 4, therefore, uses precise timing of the voltages on control nodes C1, C2 and C3.

Furthermore, if a diode D1 shown in dashed lines in FIG. 4 is present in the structure of transistor C2, an additional diode D2 shown in dashed lines is required in order to allow the output voltage on node 42 to drop more than one diode drop below ground. As is apparent from FIG. 4, if diode D2 were not present, the voltage on node 42 would not be able to fall more than one diode drop below ground, due to diode D1 conducting current from the supply voltage GND to node 42. Even if diode D2 is provided to block this conduction, control node C3 must still be precisely controlled so that the turning on of transistor 45 will coincide with the time when the voltage on node 42 reaches one diode drop below ground GND. These timing requirements on the control nodes of the structure of FIG. 4 render using the design of FIG. 4 difficult, especially when temperature variations on the threshold voltages of the transistor are considered.

Figure 5:
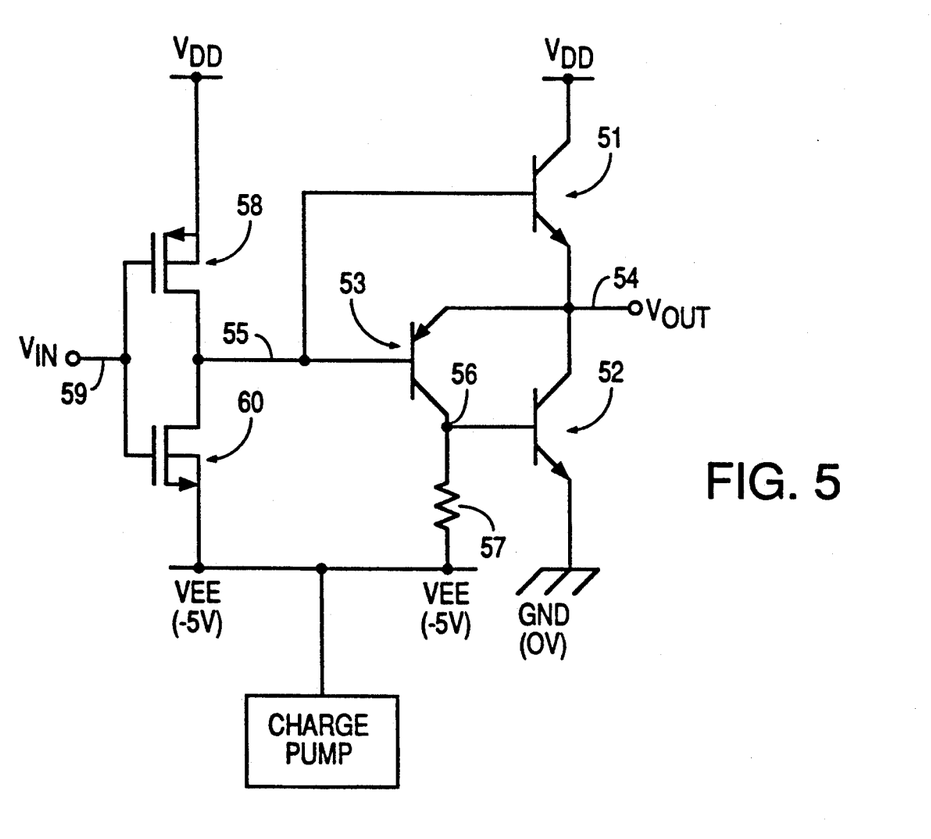
FIG. 5 is a circuit diagram of a second embodiment of the present invention for sinking current to two supply voltages, ground and $V_{EE}$.

A second gate driver circuit of the present invention for sinking current to two supply voltages is therefore disclosed in FIG. 5. This gate driver comprises a first NPN bipolar transistor 51, a second NPN bipolar transistor 52, and a PNP bipolar transistor 53. The collector of transistor 51 is connected to supply voltage $V_{DD}$. $V_{DD}$ may, for example, be +15 volts. The emitter of transistor 51 is connected to an output terminal 54. The base of transistor 51 is connected to an input node 55. The collector of transistor 52 is connected to output node 54. The emitter of transistor 52 is connected to a low impedance supply voltage GND of, for example, 0 volts. The base of transistor 52 is connected to an intermediate node 56. The emitter of transistor 53 is connected to output node 54, the base of transistor 53 is connected to input node 55, and the collector of transistor 53 is connected to intermediate node 56. A resistance 57 is connected between intermediate node 56 and a relatively high impedance supply voltage $V_{EE}$.

A CMOS inverter drives input node 55. The gate of a P channel field effect transistor 58 is connected to an input terminal 59. The source of P channel transistor 58 is connected to the $V_{DD}$ supply voltage. The drain of P channel transistor 58 is connected to node 55. The gate of an N channel field effect transistor 60 is also connected to input terminal 59. The source of N channel transistor 60 is connected to the $V_{EE}$ supply voltage. The source of the N channel transistor 60 is connected to node 55.

In operation, when the voltage on input terminal 59 has been low below the switching point of the CMOS inverter for a period of time, the voltage on node 55 is high at $V_{DD}$ due to the inverting operation of the CMOS inverter. When input node 55 has been at $V_{DD}$ for a period of time, the voltage on output terminal 54 $V_{OUT}$ is within a diode drop of $V_{DD}$ due to the 0.7 forward bias base-to-emitter voltage drop of transistor 51. The voltage on the gate of transistor 53 is also at $V_{DD}$, so the base of transistor 53 cannot be 0.7 volts higher than the emitter of transistor 53. Transistor 53 therefore cannot be conductive. If transistor 53 is not conductive, resistance 57 pulls intermediate node 56 down toward $V_{EE}$, thereby pulling the base of transistor 52 down toward $V_{EE}$. The base-to-emitter voltage of transistor 52 is therefore less than 0.7 volts and transistor 52 remains off. With transistors 52 and 53 switched off and transistor 51 conductive and pulling output terminal 54 up toward $V_{DD}$, the voltage on node 54 $V_{OUT}$ is pulled high to approximately $V_{DD}$ minus 0.7 volts.

When the voltage on input terminal 59 transitions from low to high, the CMOS inverter causes the voltage on node 55 to transition from $V_{DD}$ to $V_{EE}$. When node 55 transitions to $V_{EE}$, the voltage on the base of transistor 51 also transitions to $V_{EE}$. Regardless of the voltage on output terminal 54, the base-to-emitter voltage on transistor 51 cannot be a positive 0.7 volts if the base of transistor 51 is at $V_{EE}$. Transistor 51 is therefore turned off. This is the situation depicted in FIG. 6A. P channel transistor 58 of the CMOS inverter and NPN bipolar transistor 51 are not shown in FIGS. 6A and 6B because these transistors are not conducting.

Figure 6A:
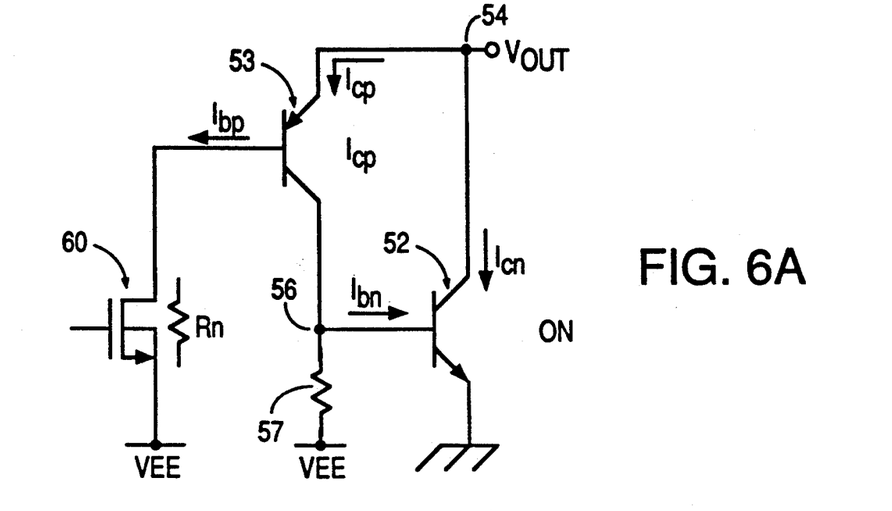
FIG. 6A is a circuit diagram of the first stage of current flow in the present invention of FIG. 5 when the present invention is pulling the voltage $V_{OUT}$ on the output terminal low.

With the voltage on node 55 being driven down to $V_{EE}$, and with the voltage on output terminal 54 $V_{OUT}$ having been high at or near $V_{DD}$ minus 0.7 volts, the emitter-to-base voltage $V_{bep}$ of transistor 53 becomes 0.7 volts, a base current $I_{bp}$ flows from the base of transistor 53 through N channel transistor 60 of the CMOS inverter to the supply voltage $V_{EE}$, and transistor 53 switches on. The magnitude of this base current Ibp is $$I_{bp}=(V_{OUT}-V_{EE}-0.7)/Rn$$

where Rn is the drain-to-source on resistance of N channel transistor 60. If the collector current and the emitter current of transistor 53 are assumed to be approximately identical, transistor 53 conducts collector current Icp from output terminal 54 to the $V_{EE}$ supply voltage through resistance 57. With transistor 53 conducting current through resistance 57, a voltage is dropped across resistance 57 and the voltage on the collector of transistor 53 climbs from $V_{EE}$. Because the base of transistor 52 is connected to the collector of transistor 53, the base of transistor 52 also climbs. Consequently, when the voltage on node 56 reaches 0.7 volts above GND, the base-to-emitter junction of transistor 52 becomes forward biased and a base current $I_{bn}$ flows into the base of transistor 52. Transistor 52 therefore turns on to conduct a relatively large amount of current $I_{cn}$ from output terminal 54 to ground supply voltage GND.

Assuming that the current flow through resistance 57 is negligible with respect to the current $I_{bn}$ flowing into the base of conducting transistor 52, the magnitude of current $I_{cn}$ flowing from output terminal 54 to ground supply voltage GND is $$I_{cn}=\beta n*I_{bn}=\beta n*\beta p*I_{bp}$$

where $I_{cn}=\beta n\ I_{bn}$ and where $I_{cp}=\beta p\ I_{bp}$.

Assuming that the amount of current flowing through resistor 57 is negligible with respect to $I_{bn}$, the ratio of current being supplied to the output terminal 54 from the $V_{EE}$ supply voltage to the current being supplied to output terminal 54 from ground supply voltage GND is $$\frac{I_{bp}}{I_{cn}}=\frac{I_{bp}}{\beta n*\beta p*I_{bp}}=\frac{1}{\beta n*\beta p}$$

The gate driver of the present invention therefore behaves like a Darlington pair having a current gain easily in excess of 10,000.

The gate driver of the present invention continues to operate in this mode until the voltage $V_{OUT}$ on output terminal 54 decreases from $V_{DD}$ to a voltage below the sum of the base-to-emitter voltage of NPN transistor 52

$V_{ben}$ and the collector-to-emitter voltage of transistor 53 when PNP transistor 53 is saturated $V_{cep}(sat)$. This voltage is typically about 0.7 to 0.9 volts and is generally well below the threshold voltage $V_t$ of an IGBT at room temperature. This voltage decreases at approximately 2.2 mV/° C. Since most IGBTs have a threshold voltage $V_t$ which decreases at approximately 2 to 3 mV/° C., the switching off of NPN bipolar transistor 52 will track $V_t$ of the IGBT being driven so that NPN transistor 52 will always conduct until the IGBT is turned off.

After the NPN transistor 52 turns off, the voltage $V_{OUT}$ on output terminal 54 continues its negative transition due to the forward biased emitter-to-base junction of PNP transistor 53 being in series with the equivalent resistance of the conducting N channel transistor 60 of the CMOS inverter. This is the situation depicted in FIG. 6B. The magnitude of the current flow $I_{bp}$ from output terminal 54, through the forward biased emitter-to-base junction of PNP transistor 53, through the drain-to-source on resistance of N channel transistor 60, and to the $V_{EE}$ supply voltage is determined by the equivalent on resistance of N channel transistor 60. Accordingly, the sizing of the N channel transistor 60 can be chosen to limit the maximum current sinking capability of the driver to the $V_{EE}$ supply voltage to match the current sinking capability of a charge pump circuit or any other apparatus generating the $V_{EE}$ supply voltage.

Figure 6B:
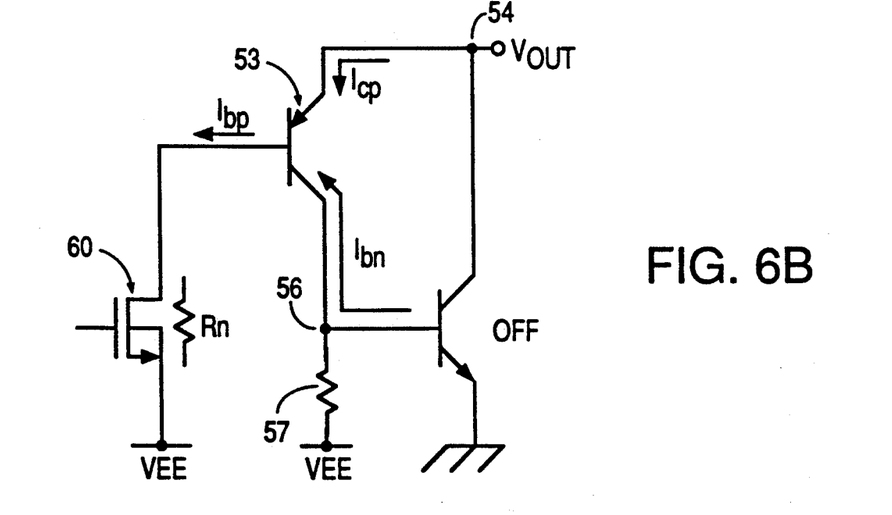
FIG. 6B is a circuit diagram of the second stage of current flow in the present invention of FIG. 5 when the present invention is pulling the voltage $V_{OUT}$ on the output terminal low.

When the voltage $V_{OUT}$ on output terminal 54 approaches ground GND potential, the voltage on the collector of conducting transistor 53 drops below 0.7 volts. The voltage across the base-to-emitter junction of NPN transistor 52 therefore falls below 0.7 volts and transistor 52 turns off. Due to the conduction of PNP transistor 53, the voltage on the output terminal 54 continues to decrease toward $V_{EE}$ until voltage $V_{OUT}$ reaches approximately 0.7 volts above $V_{EE}$.

Accordingly, the maximum reverse bias possible across the base-to-emitter junction of NPN transistor 52 is the magnitude of $V_{EE}$ plus 0.7 volts. The voltage swing on the output terminal swings between $(V_{DD}-0.7)$ volts and $(V_{EE}+0.7)$ volts. The transition between NPN transistor 52 conducting and PNP transistor 53 conducting is only a function of the voltage $V_{OUT}$ on terminal 54. It is not a function of any timed controlling of transistors. The totem pole, push pull output stage comprising transistors 51 and 52 switches fairly quickly because the only transistor to saturate in the gate driver is PNP transistor 53.

Figure 7:
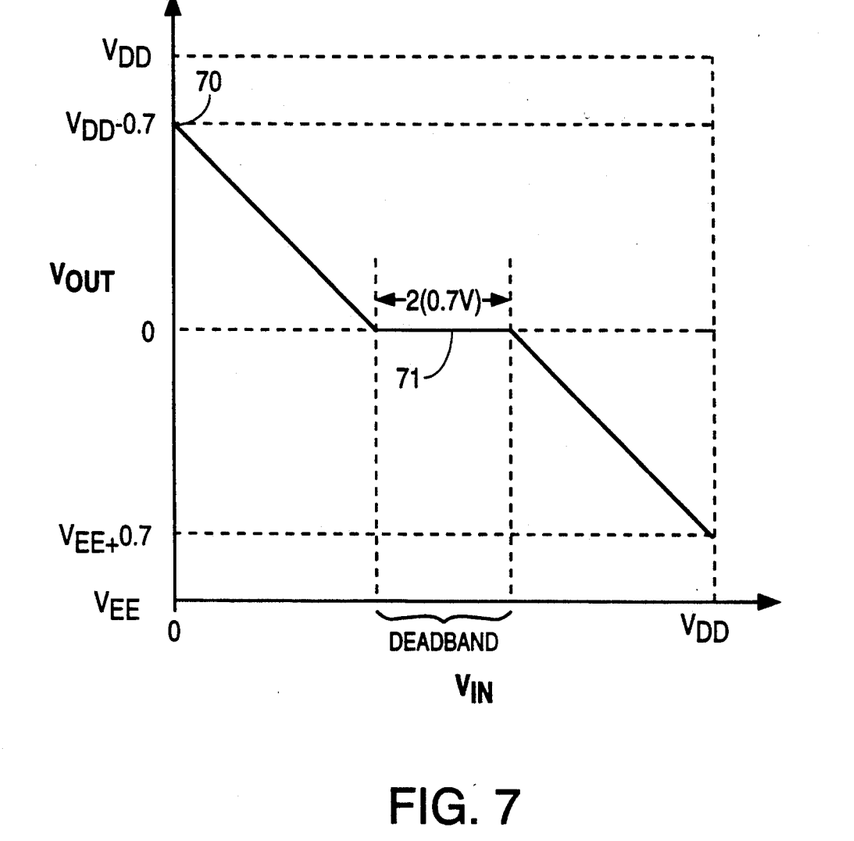
FIG. 7 is a graph showing the relationship between the input voltage $V_{IN}$ input into the present invention and the output voltage $V_{OUT}$ output from the present invention onto the output terminal.
Figure 8:
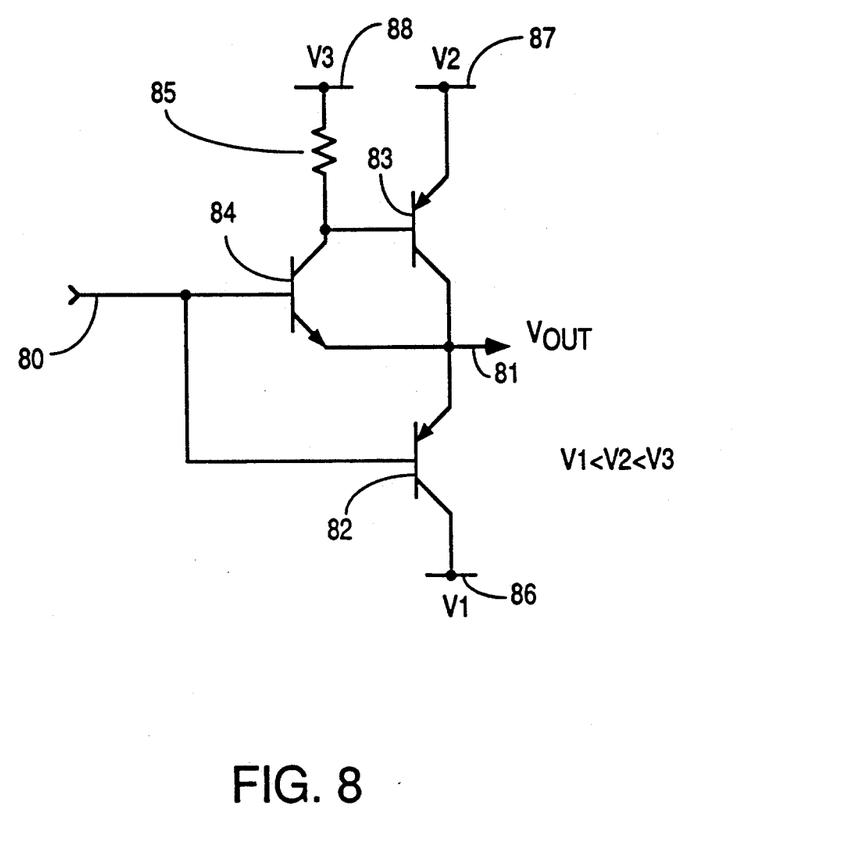
FIG. 8 is a diagram illustrating polarities in accordance with some embodiments of the present invention.

FIG. 7 shows how the voltage $V_{OUT}$ on output terminal 54 of the driver circuit of FIG. 5 varies with various voltages $V_{IN}$ on input terminal 59 of FIG. 5. As $V_{OUT}$ drops from $(V_{DD}-0.7)$ volts at the upper left 70 of the figure, a deadband region 71 is reached where $V_{IN}$ increases but $V_{OUT}$ does not change. Accordingly, neither transistor 51 or 52 is conducting current from output terminal 54 and no shoothrough is possible. There is a full 2 $V_{bc}$ deadband region that the $V_{IN}$ voltage must pass through when going from low to high or from high to low, in order for the gate driver to switch between transistor 51 and transistor 52 being the conductive transistor.

Although the invention has been described by way of the above described embodiments, certain adaptations and modifications may be practiced without departing from the scope of the claimed invention. For example, the present invention is not limited to the low-side driving of an IGBT, but may also be used as a high-side or a floating driver. The present invention is amenable to monolithic integration, with or without the charge pump for supplying $V_{EE}$. The NPN base pull down resistor may also be replaced by a MOSFFT although this implementation complicates the timing considerations. Furthermore, this invention includes a gate driver for driving a P channel IGBT as well as the gate driver for driving an N channel IGBT which is discussed above. The use of the term "ground" in this specification is only meant as a supply voltage. The actual voltage of this "ground" supply voltage may be a voltage other than zero volts. Accordingly, the above description of specific embodiments is presented only for instructional purposes and is not intended to limit the scope of the appended claims which fully define the invention.

We claim:

1. A driver circuit, having an input node for receiving a control signal and an output node, said circuit comprising:

first means for pulling a voltage on said output node to a first supply voltage when a voltage on said input node is positive with respect to said voltage on said output node;

second means for pulling a voltage on said output node to a second supply voltage when said voltage on said output node is positive with respect to said second supply voltage and when a voltage on said input node is negative with respect to said voltage on said output node; and third means for pulling a voltage on said output node to a third supply voltage when said voltage on said output node is negative with respect to said second supply voltage and when a voltage on said input node is negative with respect to said voltage on said output node, wherein said first supply voltage is positive with respect to said second supply voltage, and wherein said third supply voltage is negative with respect to said second supply voltage.

2. The circuit of claim 1, wherein said first means for pulling comprises a bipolar transistor having a base, said base being coupled to said input node.

3. The circuit of claim 2, wherein said third means for pulling comprises a bipolar transistor having a base, said base being coupled to said input node.

4. The circuit of claim 3, wherein said third means for pulling further comprises a resistance element connected between a collector of said bipolar transistor of the third means for pulling and said third supply voltage, said second means for pulling comprising a bipolar transistor having a base, said base being coupled to said collector of the bipolar transistor of said third means for pulling.

5. The circuit of claim 4, wherein the circuit has an input terminal, said circuit further comprising:

means for buffering an input voltage on said input terminal and for supplying a buffered output signal onto said input node, said means for buffering being connected to said first supply voltage and being connected to said third supply voltage.

6. The circuit of claim 5, wherein said means for buffering comprises a P channel field effect transistor coupled to said first supply voltage and a N channel field effect transistor coupled to said third supply voltage.

7. The circuit of claim 6, wherein said means for buffering comprises a CMOS inverter.

8. The circuit of claim 1, wherein the circuit has an input terminal, said circuit further comprising:
means for buffering an input voltage on said input terminal and for supplying a buffered output signal onto said input node, said means for buffering being connected to said first supply voltage and being connected to said third supply voltage.

9. The circuit of claim 8, wherein said means for buffering comprises a P channel field effect transistor coupled to said first supply voltage and a N channel field effect transistor coupled to said third supply voltage.

10. The circuit of claim 9, wherein said means for buffering comprises a CMOS inverter.

11. The circuit of claim 1 realized on a single integrated circuit chip.

12. A circuit for controlling an insulated gate bipolar transistor, having an input terminal, an intermediate node for receiving a control signal, and an output node, said circuit comprising:
first means for pulling a voltage on said output node to a first supply voltage when a voltage on said intermediate node is positive with respect to said voltage on said output node, said first means for pulling comprising a bipolar transistor having a base, said base being coupled to said intermediate node;
second means for pulling a voltage on said output node to a second supply voltage when said voltage on said output node is positive with respect to said second supply voltage and when a voltage on said intermediate node is negative with respect to said voltage on said output node, said second means for pulling comprising a bipolar transistor having a base;
third means for pulling a voltage on said output node to a third supply voltage when said voltage on said output node is negative with respect to said second supply voltage and when a voltage on said intermediate node is negative with respect to said voltage on said output node, said third means for pulling comprising a bipolar transistor having a base and a collector, said base being coupled to said intermediate node, said collector of said bipolar transistor of said third means for pulling being coupled to said base of said bipolar transistor of said second means for pulling, said third means for pulling further comprising a resistance connected between said collector of said bipolar transistor of the third means for pulling and said third supply voltage;
means for buffering an input voltage on said input terminal and for supplying a buffered output signal onto said intermediate node, said means for buffering being connected to said first supply voltage and being connected to said third supply voltage; and
said insulated gate bipolar transistor having an insulated gate, said insulated gate being coupled to said output node,
wherein said first supply voltage is positive with respect to said second supply voltage, wherein said third supply voltage is negative with respect to said second supply voltage.

13. The circuit of claim 12 realized on a single integrated circuit chip.

14. A circuit, having an input terminal, an input node and an output node, said circuit comprising:
first means for pulling a voltage on said output node to a first supply voltage when a voltage on said input node is positive with respect to said voltage on said output node, said first means for pulling comprising a bipolar transistor having a base, said base being coupled to said input node;
second means for pulling a voltage on said output node to a second supply voltage when said voltage on said output node is positive with respect to said second supply voltage and when a voltage on said input node is negative with respect to said voltage on said output node, said second means for pulling comprising a bipolar transistor having a base;
third means for pulling a voltage on said output node to a third supply voltage when said voltage on said output node is negative with respect to said second supply voltage and when a voltage on said input node is negative with respect to said voltage on said output node, said third means for pulling comprising a bipolar transistor having a base and a collector, said base of said bipolar transistor of said third means for pulling being coupled to said input node, said collector of said bipolar transistor of said third means for pulling being coupled to said base of said bipolar transistor of said second means for pulling, said third means for pulling further comprising a resistance element connected between said collector of said bipolar transistor of the third means for pulling and said third supply voltage;
means for buffering an input voltage on said input terminal and for supplying a buffered output signal onto said input node, said means for buffering being connected to said first supply voltage and being connected to said third supply voltage,
wherein said first supply voltage is positive with respect to said second supply voltage, wherein said third supply voltage is negative with respect to said second supply voltage, and wherein said third supply voltage is generated by a charge pump circuit.

15. The circuit of claim 14 realized on a single integrated circuit chip.

16. A method of driving a transistor having an input terminal, comprising the steps of:
conducting current, using a first means for conducting, between said input terminal of said transistor and a first supply voltage when a voltage on an input node is positive with respect to a voltage on said input terminal;
conducting current, using a second means for conducting, between said input terminal of said transistor and a second supply voltage when a voltage on said input node is negative with respect to a voltage on said input terminal and when said voltage on said input terminal is positive with respect to said second supply voltage; and
conducting current, using a third means for conducting, between said input terminal of said transistor and a third supply voltage when a voltage on said input node is negative with respect to a voltage on said input terminal and when said voltage on said input terminal is negative with respect to said second supply voltage.

17. The method of claim 16, wherein said third means for conducting comprises a resistance element having a magnitude, the method comprising the step of:
choosing the magnitude of the resistance element to limit a maximum current flow from said third supply voltage.

18. The method of claim 16, wherein said method further comprises the step of:

using an inverter to drive said input node, wherein said inverter is connected to said first supply voltage and is connected to said third supply voltage so that a voltage on said input node swings substantially between said first supply voltage and said third supply voltage.

19. A method of driving a transistor having an input terminal, comprising the steps of:

using a first means for conducting to conduct current between said input terminal of said transistor and a first supply voltage when a voltage on an input node is positive with respect to a voltage on said input terminal;

using a second means for conducting to conduct current between said input terminal of said transistor and a second supply voltage when a voltage on said input node is negative with respect to a voltage on said input terminal and when said voltage on said input terminal is positive with respect to said second supply voltage; and using a third means for conducting to conduct current between said input terminal of said transistor and a third supply voltage when a voltage on said input node is negative with respect to a voltage on said input terminal and when said voltage on said input terminal is negative with respect to said second supply voltage, wherein said transistor is an insulated gate bipolar transistor having a gate, and wherein said input terminal is connected to said gate.

20. A method of driving a transistor having an input terminal, comprising the steps of:

using a first means for conducting to conduct current between said input terminal of said transistor and a first supply voltage when a voltage on an input node is positive with respect to a voltage on said input terminal;

using a second means for conducting to conduct current between said input terminal of said transistor and a second supply voltage when a voltage on said input node is negative with respect to a voltage on said input terminal and when said voltage on said input terminal is positive with respect to said second supply voltage; and using a third means for conducting to conduct current between said input terminal of said transistor and a third supply voltage when a voltage on said input node is negative with respect to a voltage on said input terminal and when said voltage on said input terminal is negative with respect to said second supply voltage, wherein said step of using said first means for conducting, said step of using said second means for conducting, and said step of using said third means for conducting are performed so that said first means for conducting conducts substantially no current when either of said second means for conducting and said third means for conducting are conducting current.

21. A method, comprising the steps of:

using a first means for conducting to conduct current between an input terminal of a transistor and a first supply voltage when a voltage on an input node is positive with respect to a voltage on said input terminal;

using a second means for conducting to conduct current between said input terminal of said transistor and a second supply voltage when a voltage on said input node is negative with respect to a voltage on said input terminal and when said voltage on said input terminal is positive with respect to said second supply voltage; and using a third means for conducting to conduct current between said input terminal of said transistor and a third supply voltage when a voltage on said input node is negative with respect to a voltage on said input terminal and when said voltage on said input terminal is negative with respect to said second supply voltage;

using an inverter to drive said input node, wherein said inverter is connected to said first supply voltage and is connected to said third supply voltage so that a voltage on said input node swings substantially between said first supply voltage and said third supply voltage, wherein said inverter comprises an N channel field effect transistor having an on resistance with a magnitude; and choosing the magnitude of the on resistance of the N channel field effect transistor of the inverter to limit a maximum current flow from said third supply voltage.

22. A circuit having an input node and an output node, the circuit comprising:

a first transistor having a first terminal, a second terminal and a control terminal, said first terminal of said first transistor begin coupled to said output node, said second terminal of said first transistor being coupled to a first supply voltage, said control terminal of said first transistor being coupled to said input node;

a second transistor having a first terminal, a second terminal and a control terminal, said first terminal of said second transistor being coupled to a second supply voltage, said second terminal of said second transistor being coupled to said output node, said control terminal of said second transistor being coupled to an intermediate node;

a third transistor having a first terminal, a second terminal and a control terminal, said first terminal of said third transistor being coupled to said output node, said second terminal of said third transistor being coupled to said intermediate node, said control terminal of said third transistor being coupled to said input node; and a resistance element connected between said intermediate node and a third supply voltage.

23. The circuit of claim 22, wherein said first supply voltage is positive with respect to said second supply voltage, and wherein said third supply voltage is negative with respect to said second supply voltage.

24. The circuit of claim 22, wherein said first supply voltage is negative with respect to said second supply voltage, and wherein said third supply voltage is positive with respect to said second supply voltage.

25. The circuit of claim 22, wherein said first terminals of said first, second and third transistors are emitter terminals, and wherein said control terminals of said first, second, and third transistors are base terminals.

26. The circuit of claim 22, further comprising an inverter having an inverter input node and an inverter output node, said inverter output node being coupled to said control terminal of said third transistor, said inverter being connected to said first supply voltage and said third supply voltage.

27. The circuit of claim 26, wherein said inverter comprises a resistance element connected between said third supply voltage and said control terminal of said third transistor.

28. The circuit of claim 26, further comprising an insulated gate bipolar transistor having a gate, said gate being coupled to said output node.

29. The circuit of claim 22 realized on a single integrated circuit chip.

30. A circuit having an input node and an output node, the circuit comprising:
a first transistor having a first terminal, a second terminal and a control terminal, said first terminal of said first transistor being coupled to said output node, said second terminal of said first transistor being coupled to a first supply voltage, said control terminal of said first transistor being coupled to said input node;
a second transistor having a first terminal, a second terminal and a control terminal, said first terminal of said second transistor being coupled to a second supply voltage, said second terminal of said second transistor being coupled to said output node, said control terminal of said second transistor being coupled to an intermediate node;
a third transistor having a first terminal, a second terminal and a control terminal, said first terminal of said third transistor being coupled to said output node, said second terminal of said third transistor being coupled to said intermediate node, said control terminal of said third transistor being coupled to said input node;
a resistance element connected between said intermediate node and a third supply voltage; and
a charge pump circuit which generates said third supply voltage.

31. The circuit of claim 30 realized on a single integrated circuit chip.

* * * * *